US012765148B2

(12) United States Patent
Cheng

(10) Patent No.: US 12,765,148 B2
(45) Date of Patent: Oct. 13, 2026

(54) LIGHT-EMITTING STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 548 days.

(21) Appl. No.: 18/356,490

(22) Filed: Jul. 21, 2023

(65) Prior Publication Data

US 2024/0234478 A1 Jul. 11, 2024

(30) Foreign Application Priority Data

Jan. 11, 2023 (CN) ........................ 202310063467.X

(51) Int. Cl.
*H10H 29/14* (2025.01)

(52) U.S. Cl.
CPC ................................ *H10H 29/142* (2025.01)

(58) Field of Classification Search
CPC .. H10H 29/142; H10H 20/819; H10H 20/825; H10W 90/00
See application file for complete search history.

(56) References Cited

U.S. PATENT DOCUMENTS

| | | | | |
|---|---|---|---|---|
| 11,728,318 B1 * | 8/2023 | Valentine | ............. | H10H 29/142 257/91 |
| 2003/0119283 A1 * | 6/2003 | Ishibashi | ............. | C23C 16/4585 438/503 |
| 2013/0106276 A1 * | 5/2013 | Miyairi | ................ | H10H 20/851 313/498 |
| 2016/0093665 A1 * | 3/2016 | Schubert | ................ | H10H 29/10 438/34 |
| 2019/0305036 A1 * | 10/2019 | Ahn | ...................... | H10H 29/142 |
| 2020/0286949 A1 * | 9/2020 | Lee | ...................... | H01L 25/0753 |

* cited by examiner

*Primary Examiner* — Su C Kim
(74) *Attorney, Agent, or Firm* — Westbridge IP LLC

(57) ABSTRACT

A light-emitting structure includes: a first region and a second region, where the second region surrounds the first region; the first region includes a plurality of first light-emitting units, and the second region includes a plurality of second light-emitting units; and a distance between adjacent first light-emitting units is less than a distance between adjacent second light-emitting units in a circumferential direction or a radial direction of the light-emitting structure. The distance between the adjacent second light-emitting units of the second region arranged on the edge is large, which improves a doping rate of a light-emitting element in the second region, so that doping rates of the light-emitting element in the first region and the second region tend to be equal, thereby solving a problem of uneven light-emitting wavelengths in the first region and the second region when the light-emitting unit is prepared by epitaxy.

19 Claims, 7 Drawing Sheets

LIGHT-EMITTING STRUCTURE

CROSS-REFERENCE TO RELATED APPLICATION

This application claims priority to Chinese Patent Application No. 202310063467.X, filed on Jan. 11, 2023, which is hereby incorporated by reference in its entirety.

TECHNICAL FIELD

The present disclosure relates to the field of semiconductor technologies, and in particular, to a light-emitting structure.

BACKGROUND

As a new generation of display technology, Micro Light Emitting Diode (Micro LED) has advantages including higher brightness, better luminous efficiency and lower power consumption compared to Liquid Crystal Display (LCD) and Organic Light Emitting Diode (OLED) technologies in conventional art.

Generally, for a manufacturing method of a Micro LED display device, a LED epitaxial wafer is usually grown epitaxially on a substrate firstly, then the LED epitaxial wafer is etched to form LED units, and a large number of LED units are transferred to a large-sized glass substrate. This process involves a number of times of transfer, which is also a reason for a low yield of the Micro LED display device.

SUMMARY

In view of this, embodiments of the present disclosure provide a light-emitting structure to solve a technical problem of uneven light-emitting wavelength in conventional technologies.

According to an aspect of the present disclosure, an embodiment of the present disclosure provides a light-emitting structure, including: a first region and a second region, where the second region surrounds the first region, the first region includes a plurality of first light-emitting units, the second region includes a plurality of second light-emitting units, and a distance between adjacent first light-emitting units of the plurality of first light-emitting units is less than a distance between adjacent second light-emitting units of the plurality of second light-emitting units in a circumferential direction of the light-emitting structure or in a radial direction of the light-emitting structure.

In an embodiment, the distance between adjacent first light-emitting units of the plurality of first light-emitting units is equal in the radial direction of the light-emitting structure.

In an embodiment, the distance between adjacent second light-emitting units of the plurality of second light-emitting units is equal in the radial direction of the light-emitting structure.

In an embodiment, the distance between adjacent first light-emitting units of the plurality of first light-emitting units is equal in the circumferential direction of the light-emitting structure.

In an embodiment, the distance between adjacent second light-emitting units of the plurality of second light-emitting units is equal in the circumferential direction of the light-emitting structure.

In an embodiment, in the radial direction of the light-emitting structure, the closer the first light-emitting unit to the second region is, the greater the distance between adjacent first light-emitting units is.

In an embodiment, in the radial direction of the light-emitting structure, the further away the second light-emitting unit from the first region is, the greater the distance between adjacent second light-emitting units is.

In an embodiment, in the circumferential direction of the light-emitting structure, the closer the first light-emitting unit to the second region is, the greater the distance between adjacent first light-emitting units is.

In an embodiment, in the circumferential direction of the light-emitting structure, the further away the second light-emitting unit from the first region is, the greater the distance between adjacent second light-emitting units is.

In an embodiment, in the circumferential direction and the radial direction of the light-emitting structure, the closer the first light-emitting unit to the second region is, the greater the distance between adjacent first light-emitting units is; the further away the second light-emitting unit from the first region is, the greater the distance between adjacent second light-emitting units is.

In an embodiment, in the circumferential direction or the radial direction of the light-emitting structure, the distance between the adjacent second light-emitting units is 1.1~3 times the distance between the adjacent first light-emitting units.

In an embodiment, a ratio of an area of the first region to an area of the light-emitting structure ranges from 0.3 to 0.98.

In an embodiment, a ratio of a light-emitting element content in an active layer of the first light-emitting unit to a light-emitting element content in an active layer of the second light-emitting unit ranges from 0.95 to 1.05.

In an embodiment, the active layer of the first light-emitting unit or the second light-emitting unit is a single quantum well of InGaN or AlGaN, or a plurality of quantum wells composed of InGaN/GaN or AlGaN/GaN, or a GaN-based material doped with indium element or aluminum element.

In an embodiment, the light-emitting element is indium or aluminum.

In an embodiment, a shape of the first region is any one of a circle, an ellipse and a polygon.

In an embodiment, an area of the first light-emitting unit is greater than or equal to an area of the second light-emitting unit.

In an embodiment, the light-emitting structure further includes a patterned substrate and light-emitting units stacked in layers, the patterned substrate includes a columnar structure and a groove arranged at intervals, and the light-emitting units include the first light-emitting units arranged in the first region and the second light-emitting units arranged in the second region; and the light-emitting units are arranged on the columnar structure or in the groove.

In an embodiment, the light-emitting units are arranged in a form of radial diffusion or in a form of matrix.

In an embodiment, the first light-emitting unit and the second light-emitting unit respectively include a first pixel, a second pixel and a third pixel, and cross-sectional area of the first pixel, the second pixel and the third pixel increases sequentially.

DETAILED DESCRIPTION OF THE EMBODIMENTS

Technical solutions in embodiments of the present disclosure will be clearly and completely described with reference to accompanying drawings corresponding to the embodiments of the present disclosure in the following description. Apparently, the described embodiments are only some, not all, embodiments of the present disclosure. Based on the embodiments in the present disclosure, all other embodiments obtained by those skilled in the art without making creative efforts fall in a protection scope of the present disclosure.

As for manufacturing of the LED epitaxial wafer, the substrate is rotated at a high speed in a furnace for metal organic chemical vapor deposition (MOCVD), trimethylgallium and nitrogen are used as a gallium source and a nitrogen source respectively, and hydrogen is used as a carrier gas to epitaxially grow a gallium nitride-based semiconductor layer on the substrate.

In order to make a growth of the LED epitaxial wafer more uniform, the substrate is rotated at a high speed. However, because of the high speed of rotation, a centrifugal force makes a thickness of a single epitaxial wafer uneven, resulting in uneven light-emitting wavelength and affecting a display effect.

During a manufacturing process of LED epitaxial wafers, on the same epitaxial wafer, due to an effect of centrifugal force, a doping rate of a light-emitting element in a central area is different with that in an edge area, resulting in a problem that light emitted from the central area of the LED has a longer wavelength. For example, when the light-emitting element is indium element, a doping rate of the indium element in the central area is higher, and a doping rate of the indium element in the edge area is lower, leading to that light emitted from the central area of the LED has a longer wavelength.

Figure 1:
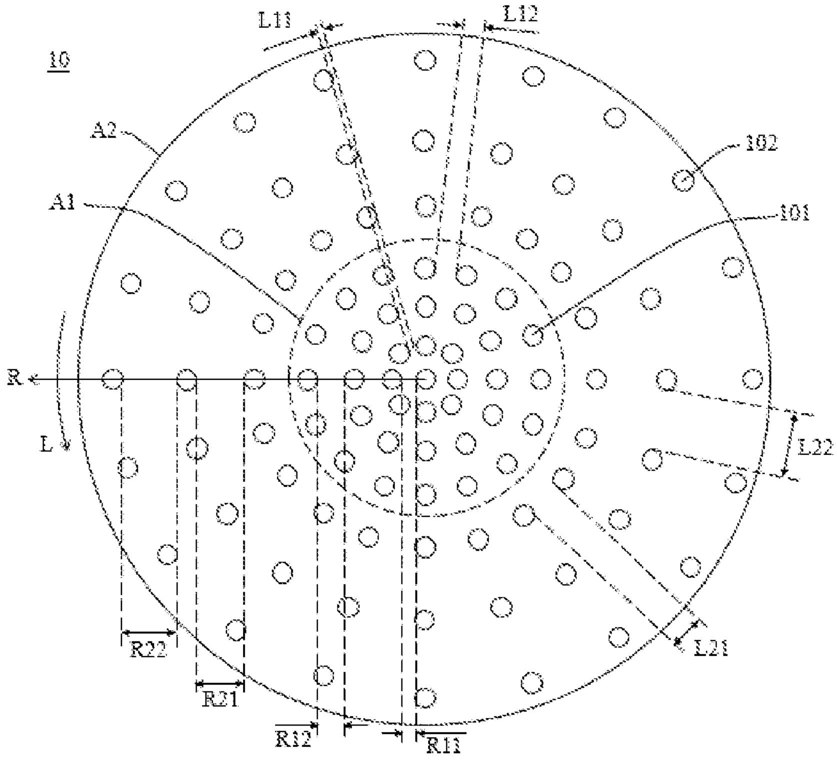
FIG. 1 is a schematic diagram of a light-emitting structure provided by an embodiment of the present disclosure.

In order to solve the above problem, an embodiment of the present disclosure provides a light-emitting structure. FIG. 1 is a schematic diagram of a light-emitting structure provided by an embodiment of the present disclosure. As shown in FIG. 1, the light-emitting structure 10 includes: a first region A1 and a second region A2 surrounding the first region A1. The first region A1 includes a plurality of the first light-emitting units 101 and the second region 2 includes a plurality of second light-emitting units 102. A distance between adjacent first light-emitting units 101 is less than a distance between adjacent second light-emitting units 102 in a circumferential direction or in a radial direction of the light-emitting structure 10.

Specifically, as shown in FIG. 1, the second region A2 surrounds the first region A1, the first region A1 is arranged in a central area of the second region A2 and surrounded by the second region A2. In a circumferential direction L of the light-emitting structure 10, a distance L11 between adjacent first light-emitting units 101 is less than a distance L21 between adjacent second light-emitting units 102; or in a radial direction R of the light-emitting structure 10, a distance R11 between adjacent first light-emitting units 101 is less than a distance R21 between adjacent second light-emitting units 102.

It should be noted that, the distance between the adjacent second light-emitting units 102 is greater than the distance between the adjacent first light-emitting units 101, therefore the light-emitting units of the second region A2 is relatively sparse, that is, in an unit area, a ratio of an area, used for growing the light-emitting units, of the second region A2 to the area of the second region A2 is small, which improves a doping rate of a light-emitting element in the second region, so that the doping rates of the light-emitting element in the first region A1 and second region A2 tend to be equal, thereby solving a problem that the light emitted from a central area of LED has a longer wavelength during epitaxial manufacturing of the light-emitting unit.

Specifically, when the light-emitting element is indium element, a doping rate of indium element in an area where an area of the light-emitting units accounts for a small proportion, namely an area where light-emitting units are sparse, is increased, so that the doping rate of the indium element in an edge area (that is, the second region A2) may be increased, which enable that the doping rates of the indium element in the first region A1 and the second region A2 of the light-emitting structure tend to be equal and the problem that light emitted from the central area of LED has a longer wavelength may be solved. When the light-emitting element is aluminum, a doping rate of aluminum element in an area where an area of the light-emitting units accounts for a small proportion, namely an area where light-emitting units are sparse, is increased, so that the doping rate of the aluminum element in an edge area (that is, the second region A2) may be increased, which enable that the doping rate of the aluminum element in the first region A1 and the second region A2 of the light-emitting structure tends to be equal and the problem that light emitted from the central area of LED has a longer wavelength may be solved.

In an embodiment, a ratio of a light-emitting element content in an active layer of the first light-emitting unit 101 to a light-emitting element content of in active layer of the second light-emitting unit 102 ranges from 0.95 to 1.05. Optionally, the light-emitting element is indium element or aluminum element, and the active layer of the light-emitting unit is a single quantum well of InGaN or AlGaN, or a plurality of quantum wells composed of InGaN/GaN or AlGaN/GaN, or a GaN-based material doped with indium element or aluminum element.

It should be noted that the light-emitting units in the second region A2 is sparser than the light-emitting units in the first region A1, so that the doping rate of the light-emitting element in the first region A1 and in the second region A2 tends to be the equal, and a difference, between the first region A1 and the second region A2, of the doped light-emitting element content may be controlled to range from 0 to 0.05 times of the light-emitting element content in the active layer of the first region A1, reducing a difference, between the first region A1 and the second region A2, of light-emitting wavelength.

It should be noted that the light-emitting structure 10 includes numerous radial directions, and FIG. 1 only shows a horizontal radial direction R. It should be noted that the first region A1 shown in FIG. 1 is a circle, the second region A2 is in the shape of a ring, and the circumferential direction L of the first region A1 is a circumferential direction concentric with the first region A1. In this embodiment, the shapes of the first region A1 and the second region A2 are not limited.

Figure 2:
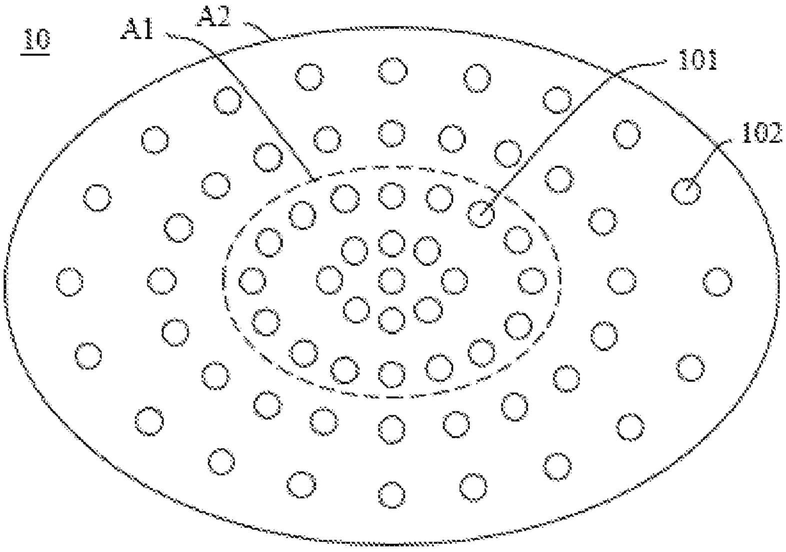
FIG. 2 is a schematic diagram of a light-emitting structure provided by another embodiment of the present disclosure.
Figure 3:
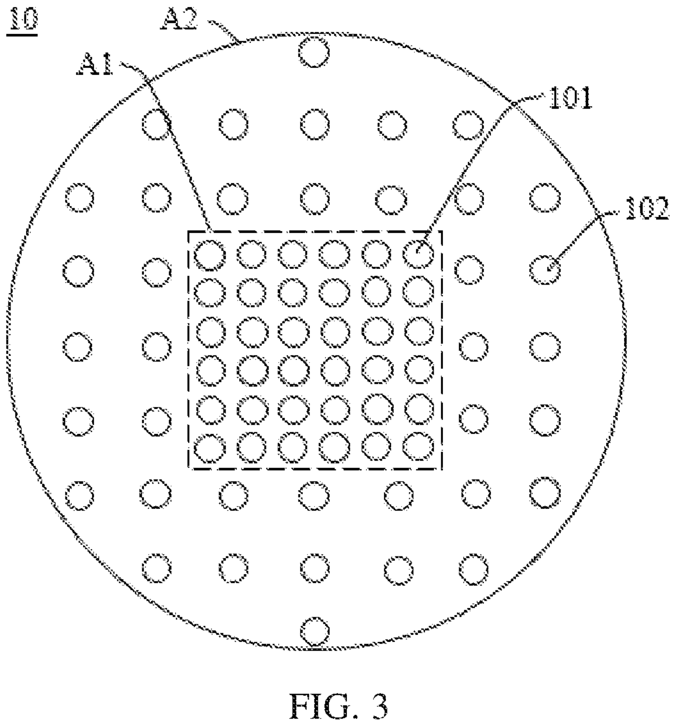
FIG. 3 is a schematic diagram of a light-emitting structure provided by another embodiment of the present disclosure.

In an embodiment, a shape of the first region A1 is any one of a circle, an ellipse or a polygon. As shown in FIG. 1, both the shapes of the first region A1 and the second region A2 are circles. FIG. 2 is a schematic diagram of the light-emitting structure provided by another embodiment of the present disclosure. As shown in FIG. 2, shapes of the first region A1 and the second region A2 are both ellipses; FIG. 3 is a schematic diagram of a light-emitting structure provided by another embodiment of the present disclosure. As shown in FIG. 3, the shape of the first region A1 is a quadrilateral, and the shape of the second region A2 is a circle. It should be noted that the above shapes are shapes of an outer contour of the structure, and the present disclosure does not limit a specific shape of the second region, and does not limit the shape of the first region to be equal with the second region. Subsequent embodiments of the present disclosure are described with the first region A1 and the second region A2 both being circles.

Figure 4:
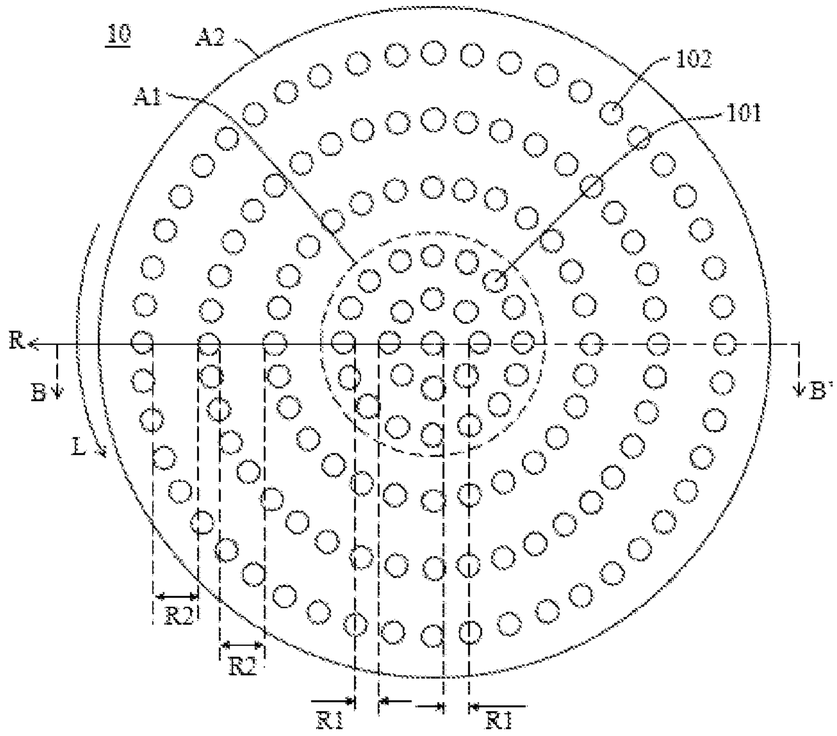
FIG. 4 is a schematic diagram of a light-emitting structure provided by another embodiment of the present disclosure.

In an embodiment, FIG. 4 is a schematic diagram of a light-emitting structure provided by another embodiment of the present disclosure. As shown in FIG. 4, in a radial direction R of the light-emitting structure 10, distances R1 between adjacent first light-emitting units 101 are equal, and/or, distances R2 between adjacent second light-emitting units 102 are equal.

Figure 5:
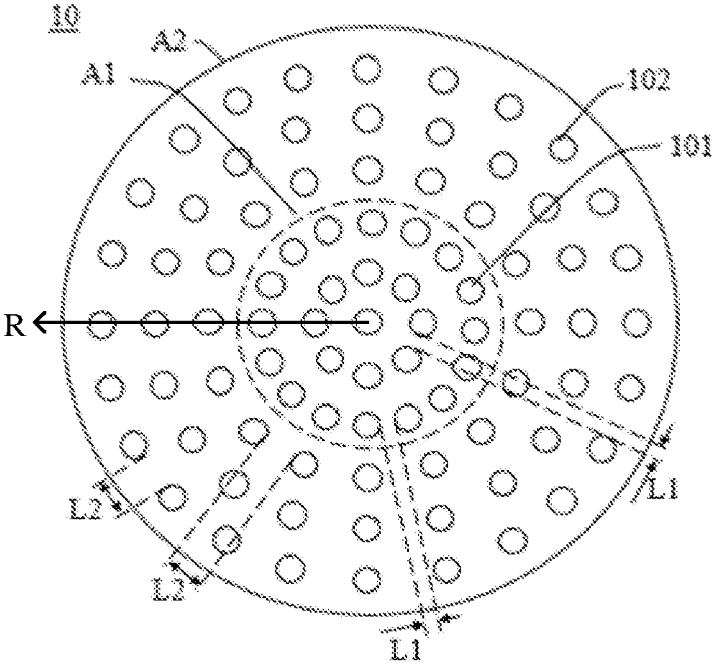
FIG. 5 is a schematic diagram of a light-emitting structure provided by another embodiment of the present disclosure.

Specifically, as shown in FIG. 4, in a radial direction R, distances between the adjacent first light-emitting units 101 are all R1. Optionally, distances between the adjacent second light-emitting units 102 are all R2, and R1 is smaller than R2, so that the light-emitting units in the second region A2 are relatively sparse, and a doping rate of a light-emitting element in the first region A1 and in the second region A2 tend to be equal, thereby solving the problem that light emitted from the central area of LED has a longer wavelength. Optionally, as shown in FIG. 4, in a circumferential direction L, the distance between the first light-emitting units 101 are equal to the distance between the second light-emitting units 102. In an embodiment, FIG. 5 is a schematic diagram of a light-emitting structure provided by another embodiment of the present disclosure. As shown in FIG. 5, in a circumferential direction L of a light-emitting structure 10, distances L1 between adjacent first light-emitting units 101 are equal and/or, distances L2 between adjacent second light-emitting units 102 are equal.

Specifically, as shown in FIG. 5, in the circumferential direction L, the distances between the adjacent first light-emitting units 101 are all L1. Optionally, the distances between the adjacent second light-emitting units 102 are all L2, and L1 is smaller than L2, so that the light-emitting units in the second region A2 are relatively sparse, and a doping rate of a light-emitting element in the first region A1 tend to be equal with a doping rate of the light-emitting element in the second region A2, thereby solving a problem that a light emitted from the central area of LED has a longer wavelength. Optionally, as shown in FIG. 5, in the radial direction R, the distances between the adjacent first light-emitting units 101 are equal to the distances between the adjacent second light-emitting units 102.

In an embodiment, as shown in FIG. 1, in the radial direction R of the light-emitting structure 10, the closer the first light-emitting units 101 to the second region A2 is, the greater the distance between the adjacent first light-emitting units 101 is; and/or, the further away the second light-emitting units 102 from the first region A1 is, the greater the distance between the adjacent second light-emitting units 102 is.

Figure 6:
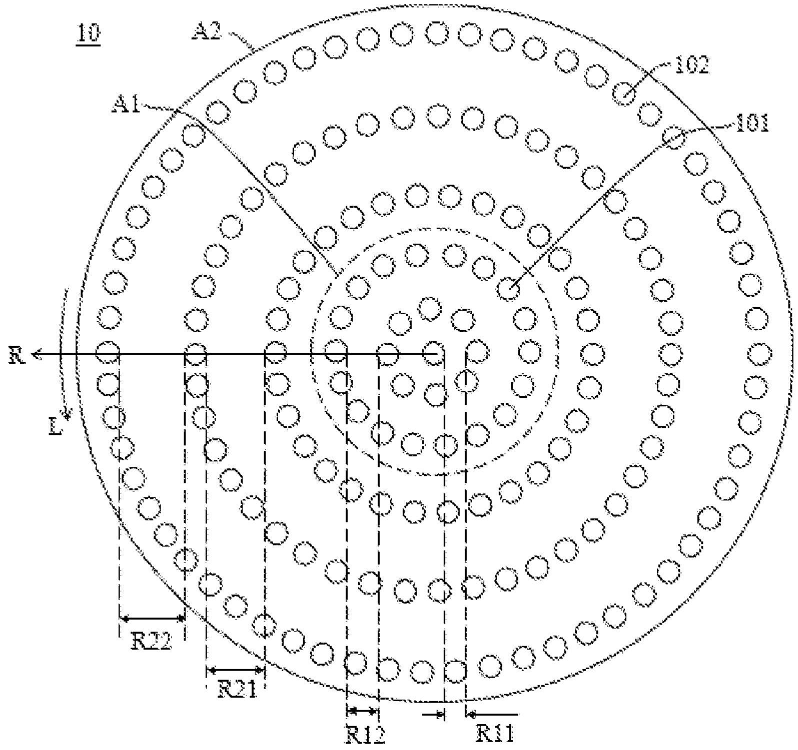
FIG. 6 is a schematic diagram of a light-emitting structure provided by another embodiment of the present disclosure.

Specifically, as shown in FIG. 1, in the radial direction R, there are two distances R11 and R12 between adjacent first light-emitting units 101 in the first region A1, R12 is closer to the second region A2, and R12 is greater than R11. Optionally, in the radial direction R, there are two distances R21 and R22 between adjacent second light-emitting units 102 in the second region A2, R22 is further away from the first region A1, and R22 is greater than R21. Optionally, FIG. 6 is a schematic diagram of a light-emitting structure provided by another embodiment of the present disclosure. As shown in FIG. 6, in a circumferential direction L, distances between adjacent first light-emitting units 101 are equal to distances between adjacent second light-emitting units 102; and in a radial direction R, R11 is smaller than R12, and R21 is smaller than R22.

In an embodiment, as shown in FIG. 1, in the circumferential direction L of the light-emitting structure 10, the closer the first light-emitting units 101 to the second region A2 is, the greater the distance between the adjacent first light-emitting units 101 is; and/or, the further away the second light-emitting units 102 from the first region A1 is, the greater the distance between the adjacent second light-emitting units 102 is.

Figure 7:
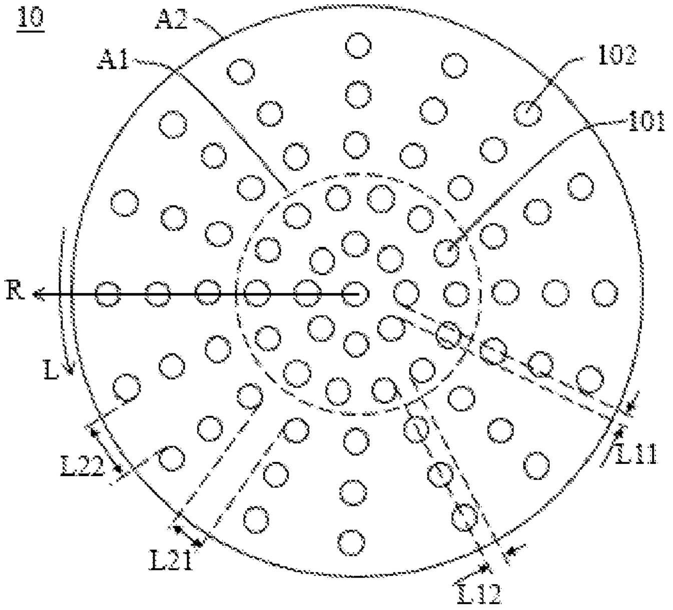
FIG. 7 is a schematic diagram of a light-emitting structure provided by another embodiment of the present disclosure.

Specifically, as shown in FIG. 1, in the circumferential direction L, there are two distances L11 and L12 between adjacent first light-emitting units 101 in the first region A1, L12 is closer to the second region A2, and L12 is greater than L11. Optionally, in the circumferential direction L, there are two distances L21 and L22 between adjacent two second light-emitting units 102 within the second region A2, L22 is further away from the first region A1, and L22 is greater than L21. Optionally, FIG. 7 is a schematic diagram of a light-emitting structure provided by another embodiment of the present disclosure. As shown in FIG. 7, in a radial direction R, distances between the adjacent first light-emitting units 101 are equal to distances between the adjacent second light-emitting units 102; and in the circumferential direction L, L11 is smaller than L12, and L21 is smaller than L22.

In an embodiment, as shown in FIG. 1, in the circumferential direction L and in the radial direction R of the light-emitting structure 10, the closer the first light-emitting unit 101 to the second region A2 is, the greater the distance between the adjacent first light-emitting unit 101 is; the further away the second light-emitting units 102 from the first region A1 is, the greater the distance between the adjacent second light-emitting units 102 is.

Specifically, in the direction of the circumferential direction L and the direction of the radial direction R, the closer the light-emitting unit to an outside is, the greater the distance between adjacent light-emitting units is. The light-emitting units of the light-emitting structure 10 are in a form of radial diffusion which makes the light-emitting units in the second region A2 relatively sparse, and a doping rate of a light-emitting element in the first region A1 tends to be equal with a doping rate of the light-emitting element in the second region A2, thereby solving a problem that a light emitted from the central area of LED has a longer wavelength.

In an embodiment, in the circumferential direction L or in the radial direction R of the light-emitting structure 10, a distance between adjacent second light-emitting units 102 is 1.1~3 times a distance between adjacent first light-emitting units 101.

Specifically, as shown in FIG. 1, for example, in the radial direction R of the light-emitting structure 10, a distance between the adjacent second light-emitting units 102 is R21, a distance between the adjacent first light-emitting units 101 is R11, and R21 is 1.1~3 times of R11; or, a distance between the adjacent second light-emitting units 102 is R22, and R22 is 1.1~3 times of R11. Optionally, a distance between the adjacent first light-emitting units 101 is R12, a distance between the adjacent second light-emitting units 102 is R21, and R21 is 1.1~3 times of R12; or a distance between the adjacent second light-emitting units 102 is R22, and R22 is 1.1~3 times of R12. The distance between the adjacent second light-emitting units 102 in the second region A2 is relatively large and the light-emitting units in the second region A2 are relatively sparse, so that a doping rate of a light-emitting element in the first region A1 tends to be equal with a doping rate of the light-emitting element in the second region A2, thereby solving the problem that a light emitted from the central area of LED has a longer wavelength.

In an embodiment, a ratio of an area of the first region A1 to an area of the light-emitting structure 10 ranges from 0.3 to 0.98, and the ratio of the area of the first region A1 to a total area of the first region A1 and the second region A2 ranges from 0.3 to 0.98.

Figure 8:
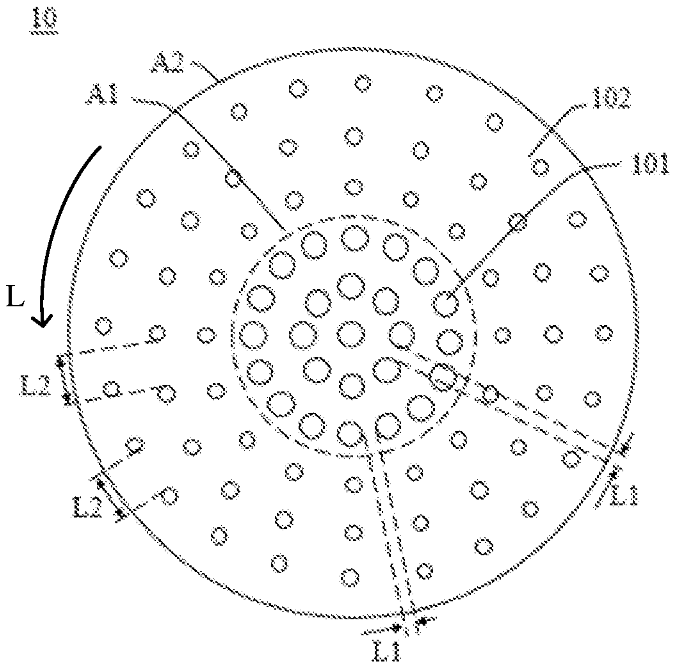
FIG. 8 is a schematic diagram of a light-emitting structure provided by another embodiment of the present disclosure.

In an embodiment, FIG. 8 is a schematic diagram of a light-emitting structure provided by another embodiment of the present disclosure. As shown in FIG. 8, an area of the first light-emitting unit 101 is greater than or equal to an area of the second light-emitting unit 102 and the light-emitting units in the second region A2 are relatively sparse, so that doping rates of a light-emitting element in the first region A1 tend to be equal with a doping rate of the light-emitting element in the second region A2, thereby solving the problem that a light emitted from the central area of LED has a longer wavelength.

Optionally, as shown in FIG. 8, for example, in the circumferential direction L of the first region A1, a distance between adjacent first light-emitting units 101 is L1, a distance between adjacent second light-emitting units 102 is L2, and L1 is less than L2.

Figure 9:
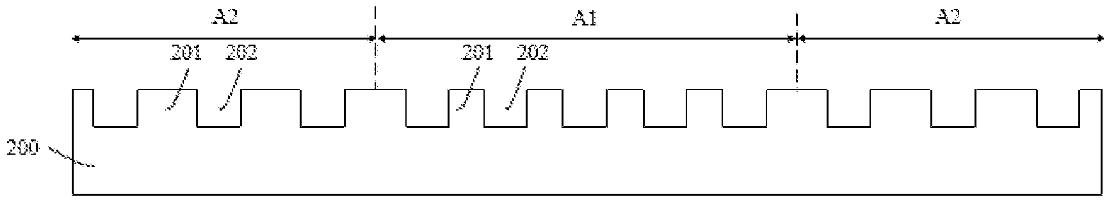
FIG. 9 is a schematic diagram of a patterned substrate provided by an embodiment of the present disclosure.
Figure 10:
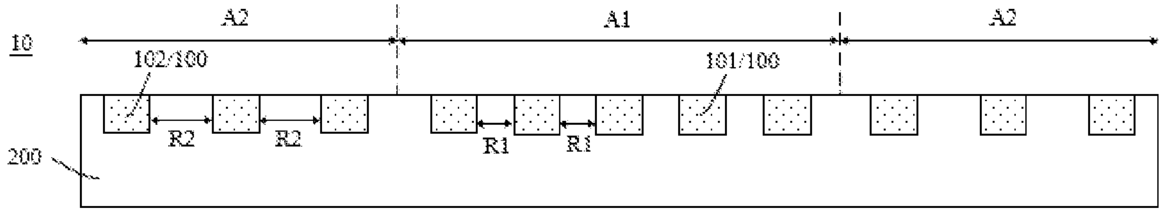
FIG. 10 is a cross-sectional diagram of an embodiment in the direction of BB' shown in FIG. 4.
Figure 11:
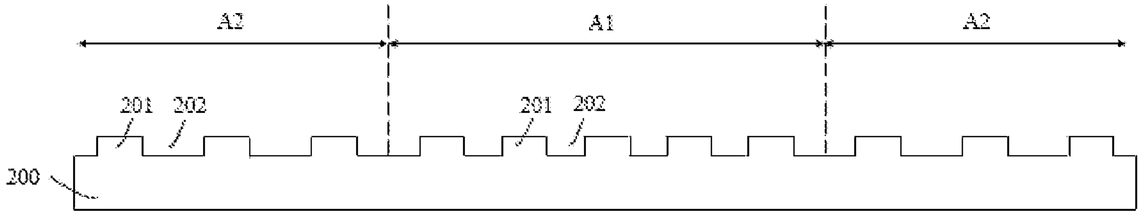
FIG. 11 is a schematic diagram of a patterned substrate provided by another embodiment of the present disclosure.
Figure 12:
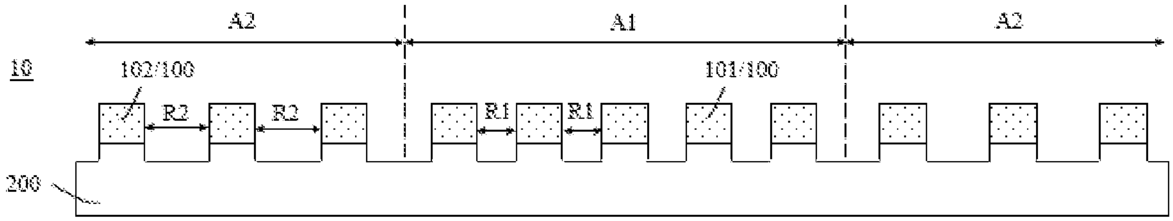
FIG. 12 is a cross-sectional diagram of another embodiment in the direction of BB' shown in FIG. 4.

In an embodiment, FIG. 9 is a schematic diagram of a patterned substrate provided by an embodiment of the present disclosure, FIG. 10 is a cross-sectional diagram of an embodiment in the direction of BB' shown in FIG. 4, and FIG. 11 is a schematic diagram of a patterned substrate provided by another embodiment of the present disclosure. FIG. 12 is a cross-sectional diagram of another embodiment in the direction of BB' shown in FIG. 4. As shown in FIG. 9 and FIG. 10, the light-emitting structure 10 includes a patterned substrate 200 and light-emitting units 100 arranged in layers, the patterned substrate 200 includes a columnar structure 201 and a groove 202 arranged at intervals, the light-emitting units 100 include a first light-emitting unit 101 arranged in a first region A1 and a second light-emitting unit 102 arranged in a second region A2; and the light-emitting units 100 is arranged in groove 202; or as shown in FIG. 11 and FIG. 12, the light-emitting units 100 are arranged on the columnar structures 201.

Specifically, FIG. 9 and FIG. 11 illustrate two kinds of the patterned substrate 200, a width of the columnar structure 201 shown in FIG. 9 in the first region A1 is R1, so that a distance between adjacent first light-emitting units 101 in the groove 202 is R1, similarly, a width of the columnar structures 201 in the second region A2 is R2, so that a distance between adjacent second light-emitting units 102 in the groove 202 is R2; a width of the groove 202 in the first region A1 shown in FIG. 11 is R1, so that a distance between adjacent first light-emitting units 101 on the columnar structure 201 is R1, similarly, a width of the groove 202 in the first region A2 is R2, so that a distance between adjacent second light-emitting units 102 on the columnar structure 201 is R2.

It should be noted that, for the patterned substrate 200 shown in FIG. 9, the light-emitting units 100 are epitaxially manufactured in the groove 202. For the patterned substrate 200 shown in FIG. 11, the light-emitting units 100 are epitaxially manufactured on the columnar structure 201.

Optionally, a material of the patterned substrate 200 is any one of sapphire, SiC, Si and a GaN-based material.

Figure 13:
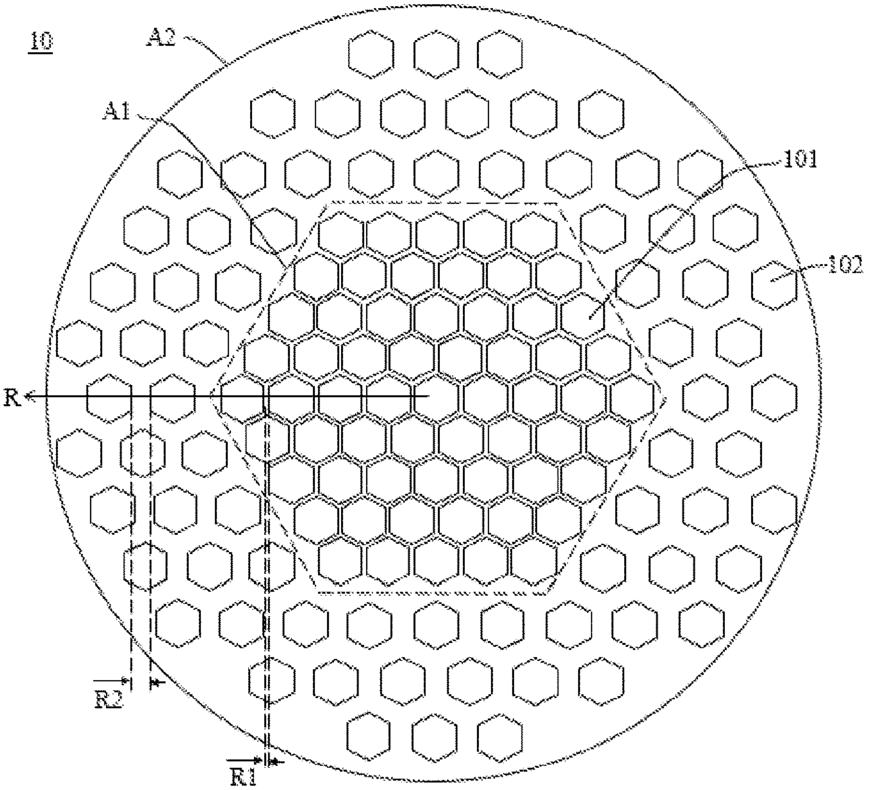
FIG. 13 is a schematic diagram of a light-emitting structure provided by another embodiment of the present disclosure.

It should be noted that, the light-emitting unit illustrated in the above embodiment is an example emitting one color, and a cross-sectional shape of the light-emitting unit may be a circle as shown in FIG. 1. Optionally, the cross-sectional shape of the light-emitting unit may be any one of a circle, an ellipse, a triangle, a quadrangle, a hexagon and other polygons. FIG. 13 is a schematic diagram of the light-emitting structure provided by another embodiment of the present disclosure. As shown in FIG. 13, the cross-sectional shape of the first light-emitting unit 101 and the second light-emitting unit 102 are both hexagonal. In a radial direction R, a distance between adjacent first light-emitting units 101 in the first region A1 is R1, a distance between adjacent second light-emitting units 102 in the second region A2 is R2, and R1 is less than R2.

Figure 14:
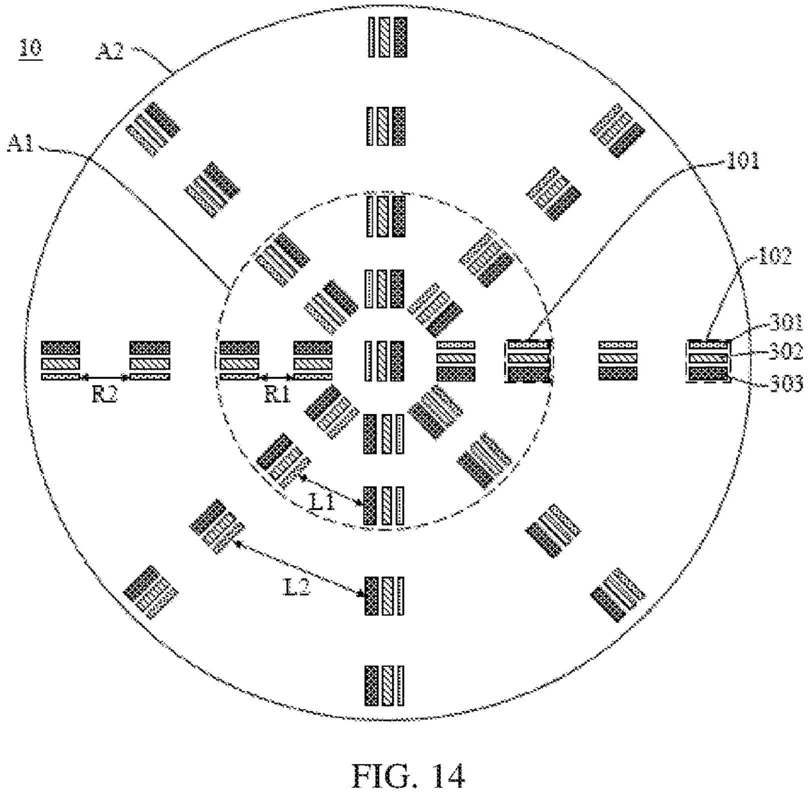
FIG. 14 is a schematic diagram of a light-emitting structure provided by another embodiment of the present disclosure.
Figure 15:
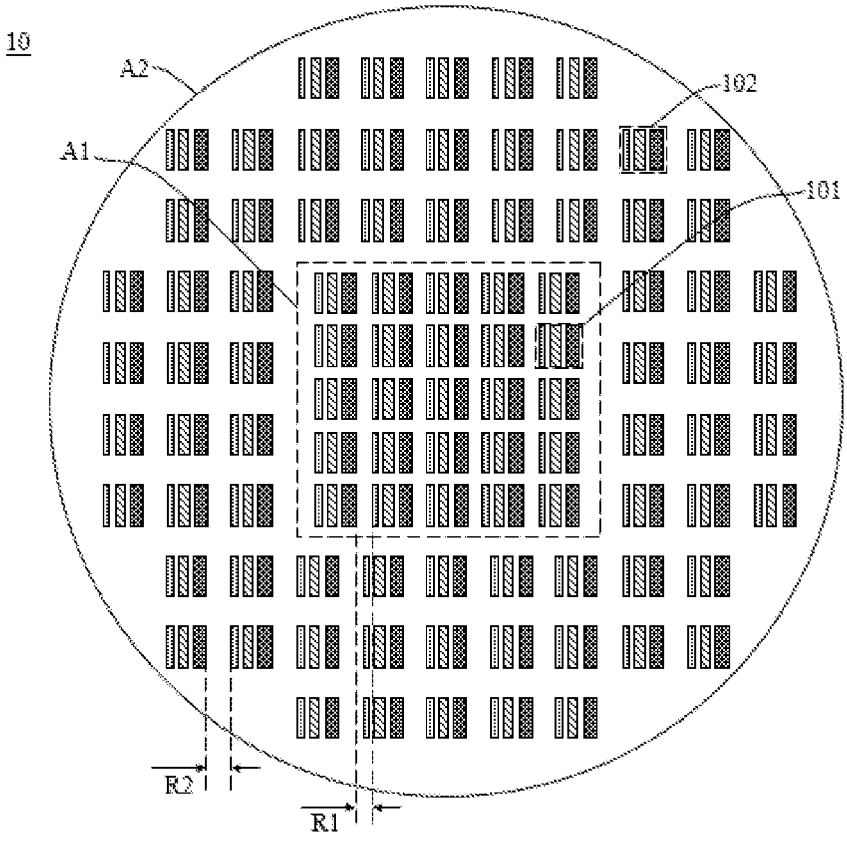
FIG. 15 is a schematic diagram of a light-emitting structure provided by another embodiment of the present disclosure.

In an embodiment, FIG. 14 is a schematic diagram of a light-emitting structure provided by another embodiment of the present disclosure, and FIG. 15 is a schematic diagram of a light-emitting structure provided by another embodiment of the present disclosure. As shown in FIG. 14 and FIG. 15, a first light-emitting unit 101 and a second light-emitting unit 102 include a first pixel 301, a second pixel 302, and a third pixel 303 respectively, and cross-sectional area of the first pixel 301, the second pixel 302, and the third pixel 303 increases sequentially.

Specifically, light-emitting element contents of the first pixel 301, the second pixel 302, and the third pixel 303 are different. For example, when the light-emitting element is indium element, a doping rate of the indium element in the first pixel 301 which is a smaller area is the highest, which may control a light-emitting wavelength of the first pixel 301 to be the longest. Therefore, the first pixel 301 is controlled to emit red light, the second pixel 302 is controlled to emit green light, and the third pixel 303 is controlled to emit blue light, finally realizing full-color display.

It should be noted that, as shown in FIG. 14, the light-emitting units are arranged in a form of radial diffusion. In a circumferential direction, from a central area to an edge area, a circumferential distance between the light-emitting units gradually increases. For example, the circumferential distance increases from L1 to L2; a radial distance between adjacent the first light-emitting units 101 is R1, a radial distance between adjacent second light-emitting units 102 is R2, and R1 is less than R2. As shown in FIG. 15, the light-emitting units are arranged in a form of matrix, a radial distance between the first light-emitting units 101 is R1, a radial distance between the second light-emitting units 102 is R2, and R1 is less than R2. The first region A1 is a rectangle, the second region A2 is a circle.

The present disclosure provides a light-emitting structure, including: a first region and a second region surrounding the first region. The first region includes a plurality of first light-emitting units, and the second region includes a plurality of second light-emitting units. In a circumferential direction or a radial direction of the light-emitting structure, a distance between adjacent first light-emitting units is smaller than a distance between adjacent second light-emitting units. The distance between the adjacent second light-emitting units of the second region arranged on the edge is relatively large, that is, the light-emitting units of the second region are relatively sparse, which improves a doping rate of a light-emitting element in the second region, so that doping rates of the light-emitting element of the light-emitting structure in the first region and the second region tend to be equal, thereby solving a problem of uneven light-emitting wavelengths in the first region and the second region when the light-emitting unit is prepared by epitaxy.

It should be understood that the term of term "including" and its variations used in this application are open-ended, that is, "including but not limited to", and the term "an embodiment" means "at least one embodiment". In the specification, schematic expressions of the above terms do not necessarily refer to the same embodiment or example. Moreover, the specific features, structures, materials, or features described may be combined in an appropriate manner in any one or more embodiments or examples. In addition, those skilled in the art may combine and assembly different embodiments or examples described in the specification, as well as the features of different embodiments or examples, without mutual contradiction. The above is only a preferred embodiment of the present disclosure and is not intended to limit it. Any modifications, equivalent replacements, etc. made within the spirit and principles of the present disclosure should be included in the scope of protection of the present disclosure.

What is claimed is:

1. A light-emitting structure, comprising:

a first region and a second region surrounding the first region; wherein the first region comprises a plurality of first light-emitting units, the second region comprises a plurality of second light-emitting units; and a distance between adjacent first light-emitting units of the plurality of first light-emitting units is less than a distance between adjacent second light-emitting units of the plurality of second light-emitting units in a circumferential direction of the light-emitting structure and in a radial direction of the light-emitting structure;

wherein an areal occupancy of the plurality of first light-emitting units in the first region is higher than an areal occupancy of the plurality of second light-emitting units in the second region per unit area, so as to increase a doping rate of a light-emitting element in an active layer in the second region relative to the first region, such that a ratio of a light-emitting element content in the active layer of the first light-emitting unit to a light-emitting element content in the active layer of the second light-emitting unit ranges from 0.95 to 1.05.

2. The light-emitting structure according to claim 1, wherein the distance between adjacent first light-emitting units of the plurality of first light-emitting units is equal in the radial direction of the light-emitting structure.

3. The light-emitting structure according to claim 1, wherein the distance between adjacent second light-emitting units of the plurality of second light-emitting units is equal in the radial direction of the light-emitting structure.

4. The light-emitting structure according to claim 1, wherein the distance between adjacent first light-emitting units of the plurality of first light-emitting units is equal in the circumferential direction of the light-emitting structure.

5. The light-emitting structure according to claim 1, wherein the distance between adjacent second light-emitting units of the plurality of second light-emitting units is equal in the circumferential direction of the light-emitting structure.

6. The light-emitting structure according to claim 1, wherein in the radial direction of the light-emitting structure, the closer the first light-emitting unit to the second region is, the greater the distance between adjacent first light-emitting units is.

7. The light-emitting structure according to claim 1, wherein in the radial direction of the light-emitting structure, the further away the second light-emitting unit from the first region is, the greater the distance between adjacent second light-emitting units is.

8. The light-emitting structure according to claim 1, wherein in the circumferential direction of the light-emitting structure, the closer the first light-emitting unit to the second region is, the greater the distance between adjacent first light-emitting units is.

9. The light-emitting structure according to claim 1, wherein in the circumferential direction of the light-emitting structure, the further away the second light-emitting unit from the first region is, the greater the distance between adjacent second light-emitting units is.

10. The light-emitting structure according to claim 1, wherein in the circumferential direction and the radial direction of the light-emitting structure, the closer the first light-emitting unit to the second region is, the greater the distance between adjacent first light-emitting units is; and the further away the second light-emitting unit from the first region is, the greater the distance between adjacent second light-emitting units is.

11. The light-emitting structure according to claim 1, wherein in the circumferential direction or the radial direction of the light-emitting structure, the distance between the adjacent second light-emitting units is 1.1~3 times the distance between the adjacent first light-emitting units.

12. The light-emitting structure according to claim 1, wherein a ratio of an area of the first region to an area of the light-emitting structure ranges from 0.3 to 0.98.

13. The light-emitting structure according to claim 1, wherein the active layer of the first light-emitting unit or the second light-emitting unit is a single quantum well of InGaN or AlGaN, or a plurality of quantum wells composed of InGaN/GaN or AlGaN/GaN, or a GaN-based material doped with indium element or aluminum element.

14. The light-emitting structure according to claim 1, wherein the light-emitting element is indium or aluminum.

15. The light-emitting structure according to claim 1, wherein a shape of the first region is any one of a circle, an ellipse and a polygon.

16. The light-emitting structure according to claim 1, wherein an area of the first light-emitting unit is greater than or equal to an area of the second light-emitting unit.

17. The light-emitting structure according to claim 1, comprising a patterned substrate and light-emitting units arranged in layers, wherein the patterned substrate comprises a columnar structure and a groove arranged at intervals, and the light-emitting units comprise the first light-emitting units arranged in the first region and the second light-emitting units arranged in the second region; and the light-emitting units are arranged on the columnar structure or in the groove.

18. The light-emitting structure according to claim 17, wherein the light-emitting units are arranged in a form of radial diffusion or in a form of matrix.

19. The light-emitting structure according to claim 1, wherein the first light-emitting unit and the second light-emitting unit comprise a first pixel, a second pixel and a third pixel respectively, and cross-sectional area of the first pixel, the second pixel and the third pixel increases sequentially.

* * * * *